(12) United States Patent
Temnykh et al.

(10) Patent No.: US 6,639,403 B2
(45) Date of Patent: Oct. 28, 2003

(54) SYSTEM AND METHOD FOR SENSING MAGNETIC FIELDS BASED ON MOVEMENT

(75) Inventors: Alexander B. Temnykh, Ithaca, NY (US); Richard V. E. Lovelace, Ithaca, NY (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 10/125,173

(22) Filed: Apr. 17, 2002

(65) Prior Publication Data

US 2002/0175670 A1 Nov. 28, 2002

Related U.S. Application Data

(60) Provisional application No. 60/283,925, filed on Apr. 17, 2001.

(51) Int. Cl.⁷ .............................................. G01R 33/00
(52) U.S. Cl. ..................................... 324/260; 324/244.1
(58) Field of Search ................................ 324/260, 244, 324/244.1, 96, 256, 226, 257, 249, 117 H; 344/4; 434/301; 331/65, 96, 154; 250/203–7, 206

(56) References Cited

U.S. PATENT DOCUMENTS 5,442,288 A * 8/1995 Fenn et al. ................. 324/244
5,959,452 A * 9/1999 Givens et al. .............. 324/260
6,215,318 B1   4/2001 Schoefthaler et al.

OTHER PUBLICATIONS

Alexander Temnykh, Wibrating Wire field–measuring, Nuclear Instruments and Methods in Physics Research A 399 (1997) 185–194.*
Landau, L.D. et al., *Fluid Mechanics, Course of Theoretical Physics*, Addison–Wesley Publishing Company, Inc. vol. 6, P. 68 (1959).
Author Unknown, *Newark Electronics 2000 Catalog 118*, "Optoelectronics, LEDs & Displays," p. 586 (2000).
Author Unknown, Newark Electronics, "Search Center" Web Page [Retrieved from the Internet at htt://www.newark.com on Apr. 22, 2002].
Temnykh, A., *Nuclear Instruments & Methods in Physics Research, Section A*, "Vibrating wire field–measuring technique," pp. 185–194 (1997).

* cited by examiner

*Primary Examiner*—N. Le
*Assistant Examiner*—Subhash Zaveri
(74) *Attorney, Agent, or Firm*—Nixon & Peabody LLP

(57) ABSTRACT

A method and system for sensing magnetic fields using an AC current carrying wire which vibrates or moves in the presence of a magnetic field. The system uses the wire movement to determine one or more characteristics of the field. The wire is connected at a first and second location to the base with an portion between the connection locations having an apex spaced apart from the base. The monitoring system detects movement of the wire at the portion while an electrical current having the same frequency as the mechanical resonant frequency of the wire is sent through the wire and a magnetic field surrounds the portion. The reporting system determines one or more characteristics of the magnetic field based upon the detected movements.

22 Claims, 11 Drawing Sheets

US 6,639,403 B2

SYSTEM AND METHOD FOR SENSING MAGNETIC FIELDS BASED ON MOVEMENT

This application claims the benefit of U.S. Provisional Patent Application Serial No. 60/283,925 filed on Apr. 17, 2001, which is herein incorporated by reference in its entirety.

FIELD OF THE INVENTION

This invention relates generally to magnetic field sensors and, more particularly, to a system and method that use an AC current carrying elastic element (e.g., wire) which vibrates or moves in the presence of a magnetic field, and using the wire movement to determine one or more characteristics of the magnetic field. The frequency of the AC current is matched to the mechanical resonant frequency of the elastic element.

BACKGROUND OF THE INVENTION

Typical magnetic field sensors in use today include compass needles, Hall probes and super-conductive quantum interference devices ("SQUIDs"). The compass needle was discovered about 2,000 years ago by the Chinese, and the Hall probes and SQUIDs were developed fairly recently. The particular sensor one might use in a given situation often depends upon several factors such as the required accuracy, sensitivity and economic constraints. For example, a compass needle is easy to use, inexpensive and does not require electric power or circuits, but it can only indicate the direction of a field. Hall probes are more robust and can measure fields over a large range of field strengths, but their accuracy is compromised by temperature changes and they have problems related to baseline drift, noisy signals and fail in high radiation environments. The most sophisticated magnetic field sensors are the SQUIDs, which can measure magnetic fields with extremely high precision. SQUIDs require liquid helium and complex circuitry to operate, however, making them expensive and impractical.

SUMMARY OF THE INVENTION

A system for sensing fields in accordance with embodiments of the present invention includes a wire having an interior wire portion and an exterior wire portion, the wire connected at a first and a second location to a base with an interior wire portion between the connection locations having an apex spaced apart from the base. A monitoring system detects movement of the wire at least at the interior wire portion while an electrical current is sent through the wire and a magnetic field surrounds at least the interior wire portion. A reporting system determines one or more characteristics of the magnetic field based upon the detected movement of the interior wire portion.

In one embodiment, the interior wire portion may have a circular or loop configuration. Alternatively, the interior wire portion may include a square configuration. In another embodiment, the monitoring system includes a set of electrodes spaced apart to form a capacitor. The interior wire movement in between the electrodes alters a capacitance value across the electrodes. The reporting system may determine the magnetic field characteristics based upon the altered capacitance values. The monitoring system alternatively may include a photo emitter that emits light towards an inlet in a photo detector. In this example, the interior wire movement deflects at least a portion of the light away from the photo detector inlet. Here, the reporting system may determine the magnetic field characteristics based upon an amount of light deflected away from the inlet.

A method for sensing fields in accordance with embodiments of the present invention includes detecting movement in a wire while sending an electrical current through the wire and a magnetic field surrounds the wire, and determining one or more characteristics of the magnetic field based upon the detected movement of the wire.

The present invention provides a convenient, efficient and inexpensive system and method for sensing magnetic fields. Additionally, the present invention enables magnetic fields to be sensed in environments where conventional devices have difficulty or are unable to function. Further, the present invention is easily manufactured and does not require expensive materials for assembly.

DETAILED DESCRIPTION OF THE INVENTION

Figure 1:
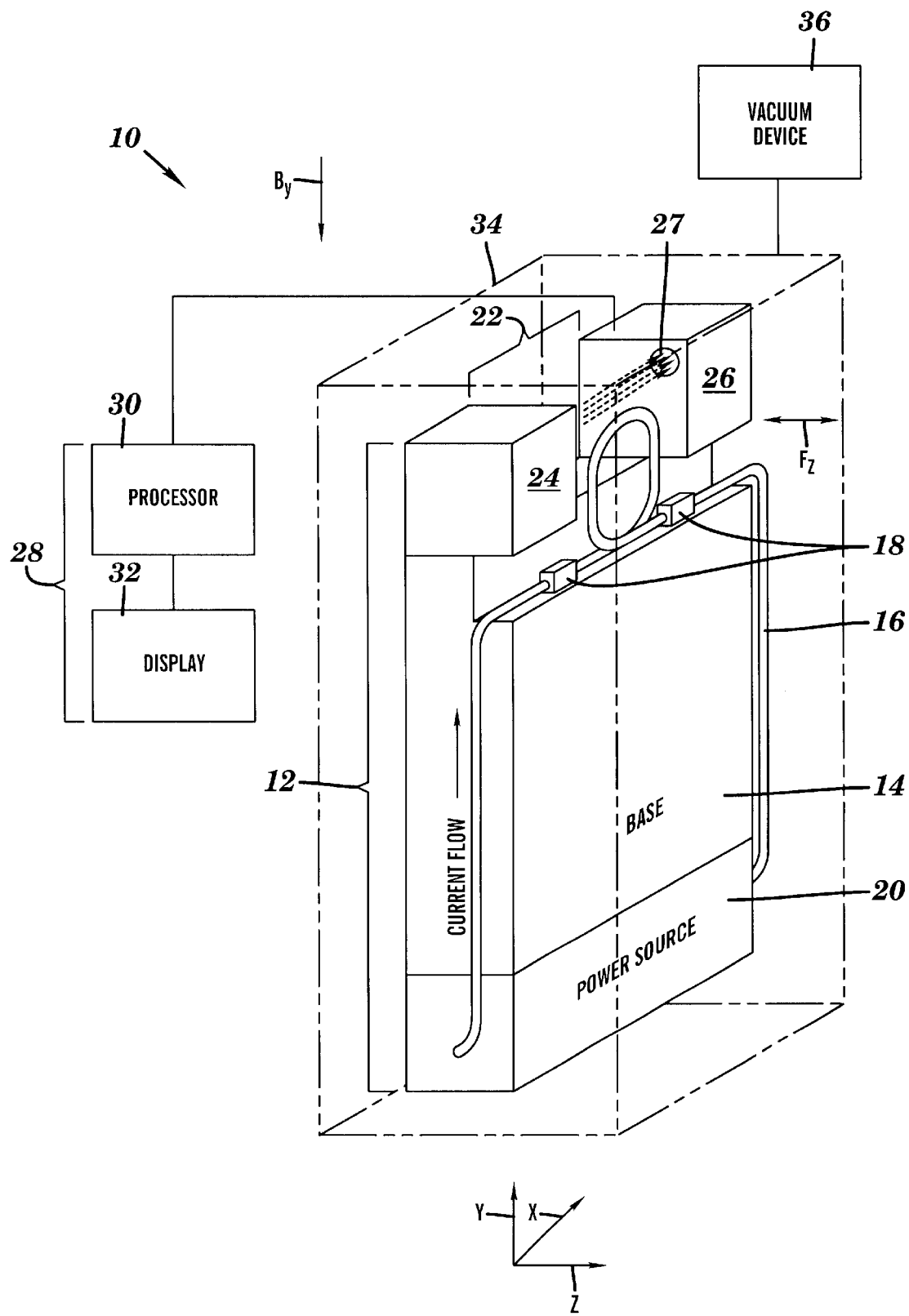
FIG. 1 is a perspective view of a system for sensing magnetic fields in accordance with one embodiment of the present invention.

A system 10 for sensing magnetic fields in accordance with embodiments of the present invention is shown in FIGS. 1–4B. The system 10 includes sensor device 12, which has a movement detection system 22 coupled to a reporting system 28. A method in accordance with embodiments of the present invention includes the movement detection system 22 in device 12 detecting movement in the wire 16 while sending an electrical current through the wire 16 and a magnetic field surrounds the wire 16, the reporting system 28 determining one or more characteristics of the magnetic field based upon the detected movement of the wire 16. The present invention provides a convenient, efficient and inexpensive system 10 and method for sensing magnetic fields. Additionally, the present invention enables magnetic fields to be sensed in environments where conventional devices have difficulty or are unable to function. Further, the present invention is easily manufactured and does not require expensive materials to be assembled.

The sensor device 12 includes base 14, wire 16, connectors 18, power source 20 and movement detection system 22. In this embodiment, the base 14 is made of a non-conductive insulating material such as plastic, or any type of conductive material (i.e., metals) having a non-conductive coating, for example.

Figure 2:
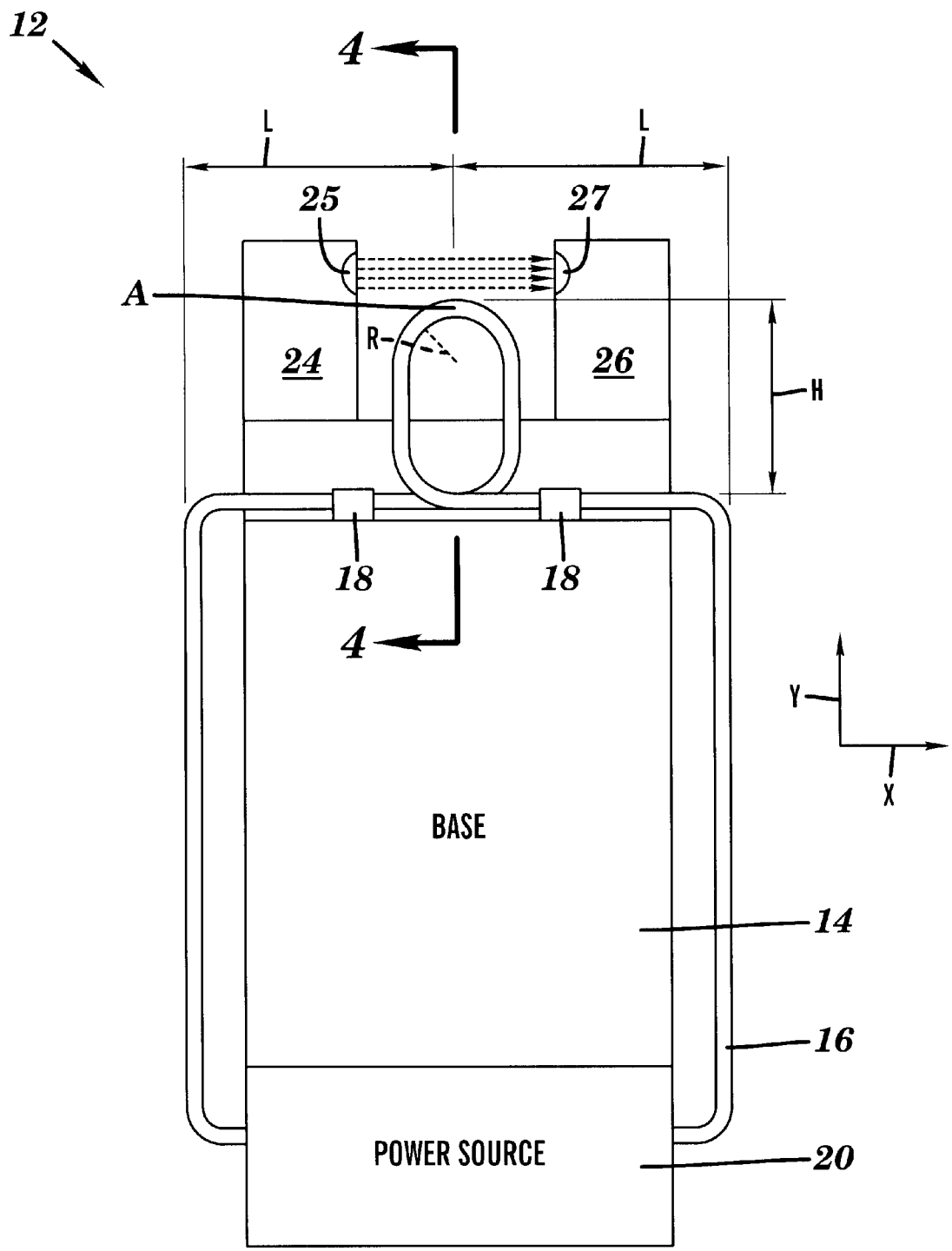
FIG. 2 is a partial front view of the system for sensing magnetic fields shown in FIG. 1.
Figure 3:
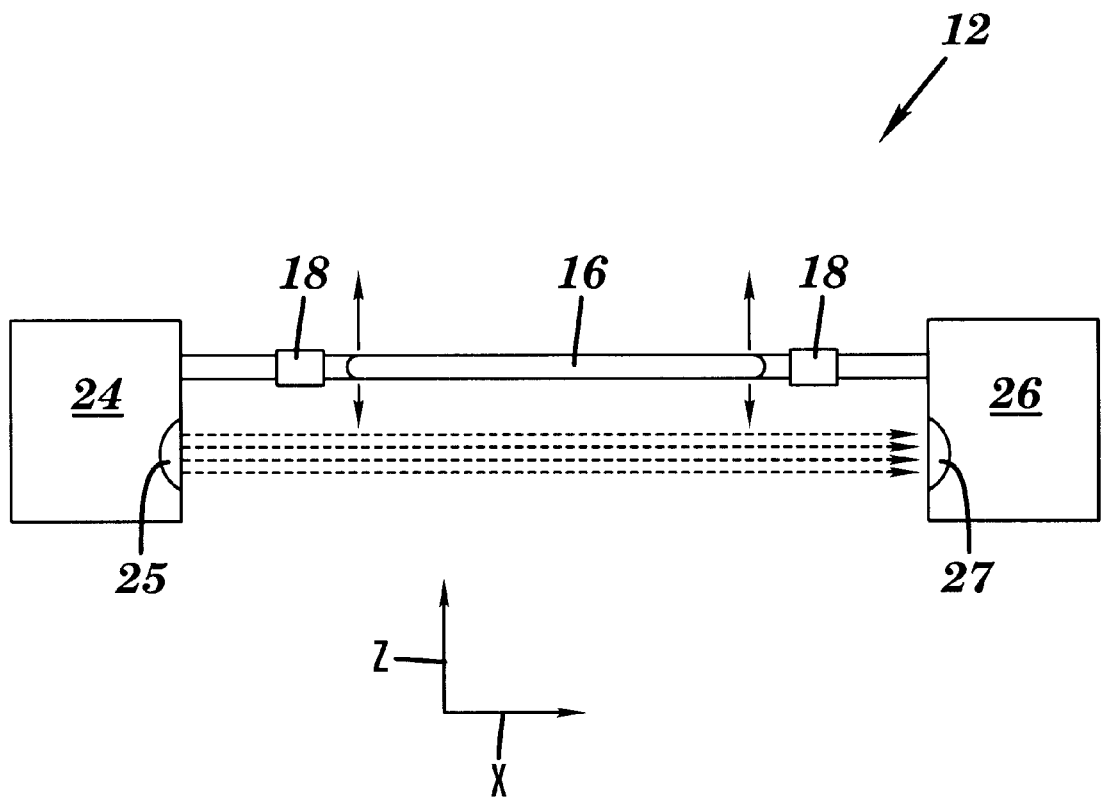
FIG. 3 is a partial cross-sectional top view of the system for sensing magnetic fields shown in FIG. 1.

The wire 16 is connected to the base 14 by connectors 18 made of solder or glue, for example. The wire 16 is made of copper, although a number of other conductive materials such as gold or platinum may be used. Further, the wire 16 has a low damping rate corresponding to a Q value of about 200, although a damping rate corresponding to a Q value of about 1000 may be obtained where the wire 16 is enclosed in a vacuum by an optional enclosure 34 as will be described further herein below. In this embodiment, an interior portion of the wire 16 in between connectors 18 has a substantially looped configuration formed by looping that section of wire onto itself as shown in FIGS. 1–4B. By way of example only, the wire 16 has a diameter ("d") of about 0.030 mm. As shown in FIG. 2, the distance between the apex A of the loop in the looped section of wire 16 and the lowest point of a horizontal section of the wire 16 over the base 14 from the looped portion and through the connectors is illustrated by line H which in this example is about 4.0 mm. Further, the length of the wire 16 illustrated by the line L measured from a first end of the horizontal section of the wire 16 to the substantial center of the looped portion is about 3.125 mm so that 2L is about 6.24 mm in this example.

Figure 4A:
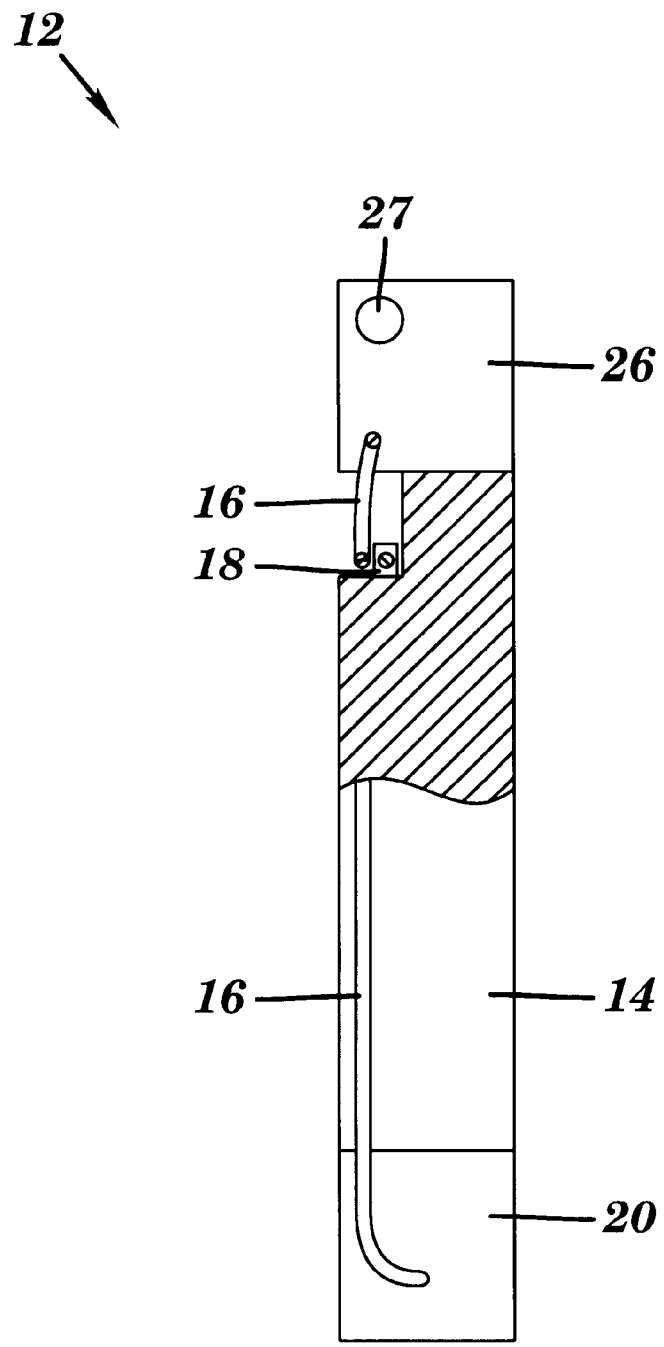
FIG. 4A is a partial cross-sectional side view taken along the line 4—4 of the system for sensing magnetic fields shown in FIGS. 1–2.
Figure 4B:
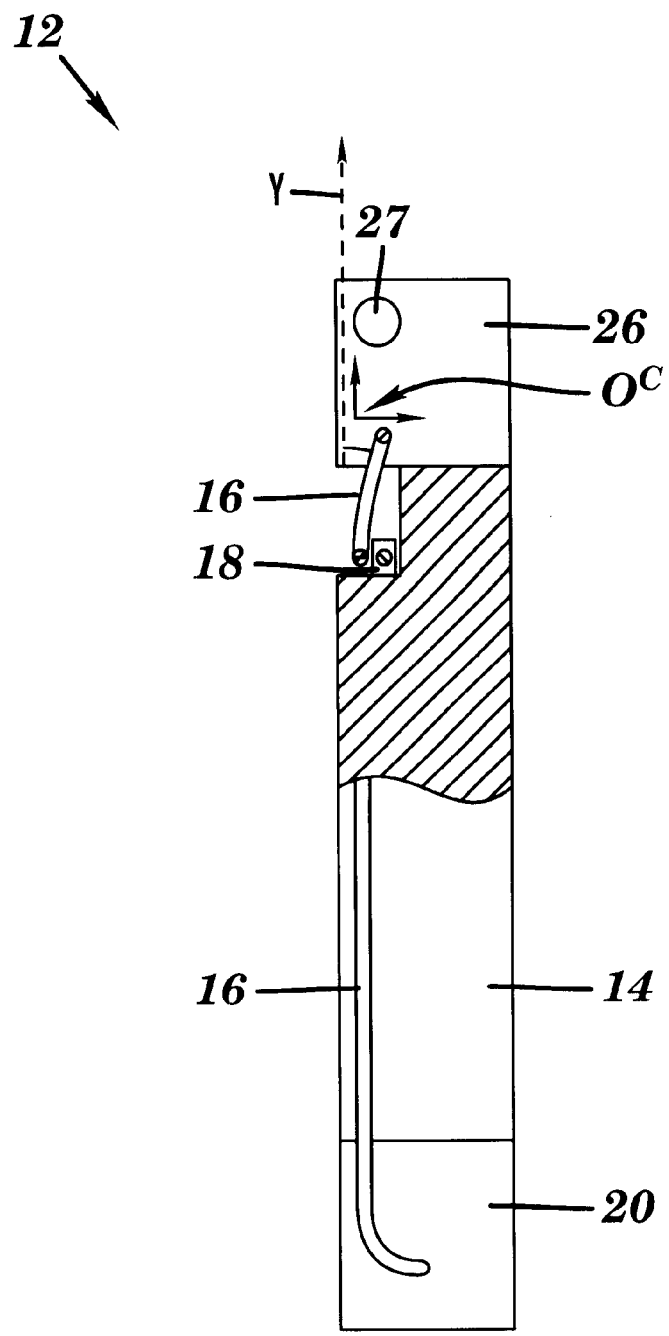
FIG. 4B is a partial cross-sectional side view taken along the line 4—4 of the system for sensing magnetic fields shown in FIGS. 1–2 showing the wire moving.

Although exemplary diameters and dimensions have been provided above, a number of other values may be used depending upon the particular application of device 12, the magnetic field intensity desired to be sensed or the types of material used to form the wire 16. Additionally, the wire 16 and other components of the device 12 may be formed to have much smaller diameters and dimensions using a variety of manufacturing methods such as nano-fabrication. The low damping rate of wire 16 mentioned earlier, the diameters and dimensions of wire 16 combined with the loop configuration formed in the interior portion of wire 16 enables at least a section nearest the apex A of the looped portion of wire 16 to be displaced and move back and forth about an a angle formed between the looped portion of the wire 16 and the Z axis to produce a substantially vibrating motion as shown in FIGS. 4A–4B for sensing magnetic signals as will described in further detail herein below. In other embodiments, the designations of the axis may be different.

Power source 20 is coupled to the wire 16 for supplying the wire 16 with an electrical current. In this embodiment, power source 20 may be an alternating current ("AC") power source. In this embodiment, the power source 20 may supply the wire 16 with an electrical current at a predetermined amplitude (e.g., about 85 mA) and at a predetermined frequency (e.g., about 259 Hz), these amplitudes and frequencies being determined during a calibration process described further herein below in connection with steps 120–160 in FIG. 6.

The movement detection system 22 includes a photo emitter 24 and a photo detector 26 mounted on the base 14. In this embodiment, the photo emitter 24 may be any device that can send light signals from an outlet 25 such as a laser emitting device or a LED device. The photo detector 26 may be any device that can detect and quantify an amount of light signals being received at an inlet 27 such as a photo diode, photo transistor or photovoltaic cell. Furthermore, the emitter 24 and detector 26 may also be an off-the-shelf type device such as an opto-electronic assembly model H21A1 manufactured by Newark Electronics Inc., for example, and described in Newark Electronics 2000, Catalog 118, p. 586, which is herein incorporated by reference in its entirety. In embodiments of the present invention, the photo emitter 24 is oriented towards the photo detector 26 and has a substantially clear line of site with respect to the detector 26 to enable the emitter 24 to send light signals towards the inlet 27. Moreover, most of the light signals may travel unobstructed along the X axis towards the detector 26, but some of the signals may strike a surface of the wire 16 in the section nearest the apex A of the looped portion when the wire 16 is in a resting state (i.e., the loop portion is not vibrating or moving) and still be reflected towards the detector 26 although the light signals may travel unobstructed along the X axis and along the periphery of the wire 16 without striking the wire.

The reporting system 28 includes a processor 30 and a display device 32, although the system 28 may comprise other components, other numbers of the components, and other combinations of the components. The processor 30 may include an analog volt meter or a digital oscillator and is coupled to the photo detector 26. In embodiments of the present invention, the processor 30 receives electrical signals from the detector 26 representing the amount of light being received by the detector 26. The processor 30 processes the electrical signals and may display a value representing the amount of light signals being received by the detector 26 using display device 32, including changes in the amount of light received.

Processor 30 may also include a central processing unit, memory, user input interface and an input/output interface, which are coupled together by a bus system or other link. The processor 30 may execute a program of stored instructions for a process of sensing magnetic fields, and to display the results using the display device 32 in accordance with at least one embodiment of the present invention as described herein and illustrated in FIGS. 5–6. Further, the programmed instructions are stored in the memory of the processor 30, although some or all could be stored and retrieved from other locations. A variety of different types of memory storage devices, such as a random access memory ("RAM") or read only memory ("ROM"), or a floppy disk, hard disk, CD ROM. or other computer readable medium that is read from and/or written to by a magnetic, optical, or other reading and/or writing system that is coupled to the processor 30, can be used for memory. The user input device enables an operator to generate and transmit signals or commands to the processor 30 during the calibration process described further herein below in connection with FIGS. 6–13. A variety of different types of user input devices can be used, such as a keyboard or computer mouse.

The system 10 optionally includes an enclosure 34 that substantially surrounds the device 12, but at least surrounds the looped portion of the wire 16. Further, the enclosure 34 may be coupled to a vacuum device 36 that evacuates air from the space within the enclosure 34 to create a vacuum within the enclosure 34. The vacuum eliminates any potential drag or friction that may be imposed upon the loop portion of the wire 16 that may otherwise hamper the ability of the wire 16 to vibrate and ultimately reduce the sensitivity of the of the device 12.

Figure 5:
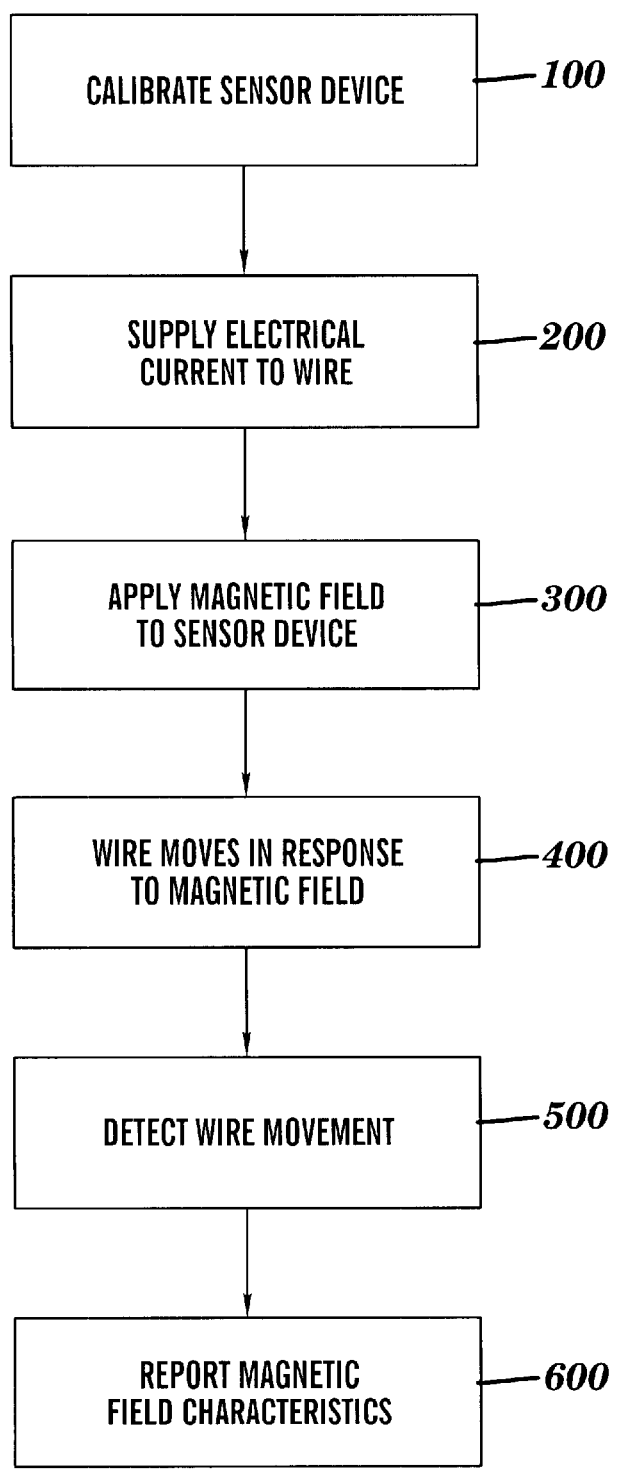
FIG. 5 is a flow chart of a process for sensing magnetic fields in accordance with another embodiment of the present invention.

The operation of the system 10 for sensing magnetic fields in accordance with embodiments of the present invention will now be described with reference to FIGS. 1–13. Referring to FIG. 5 and beginning at step 100, the device 12 is calibrated and if the optional enclosure 34 and vacuum device 36 are used, the vacuum device 36 is operated to create a vacuum within the enclosure 34.

Figure 6:
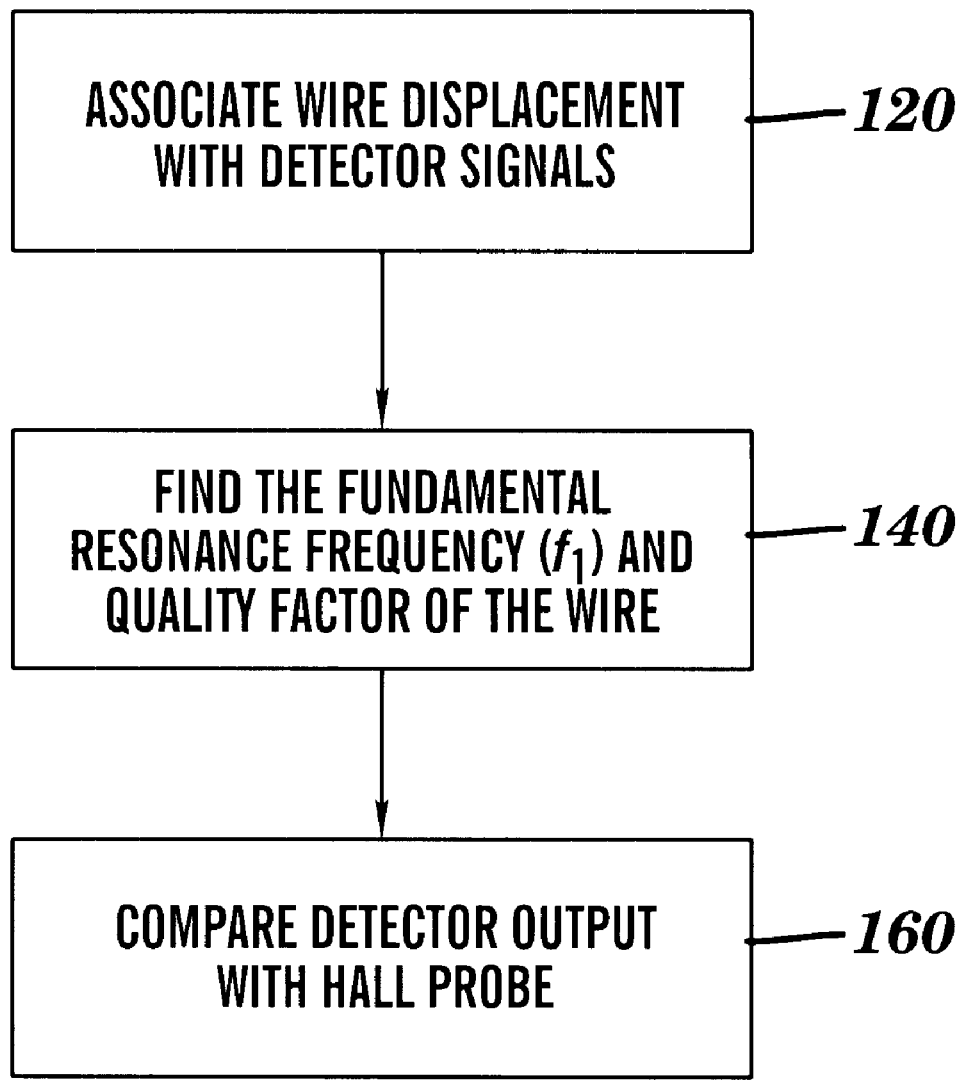
FIG. 6 is a flow chart of a process for calibrating a magnetic field sensor system in accordance with another embodiment of the present invention.
Figure 7:
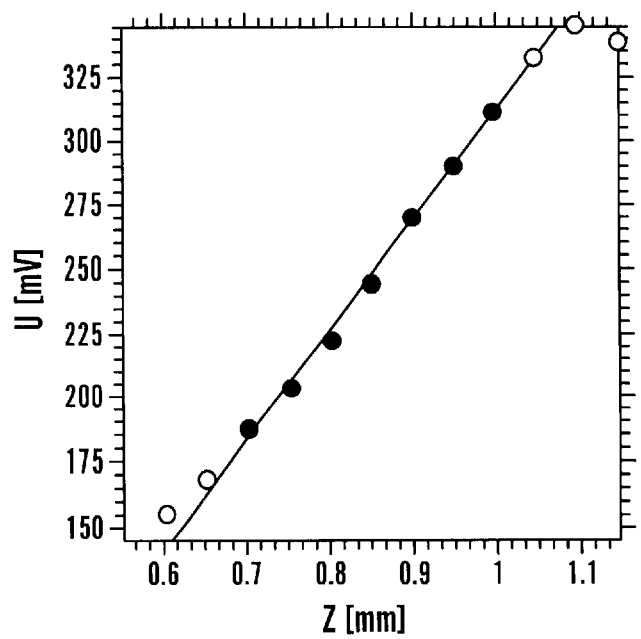
FIG. 7 is a graph showing the relationship between an amount of wire displacement and an electrical signal output from the detection system.

Referring to FIG. 6, a sensor device 12 calibration process will now be described in accordance with an embodiment of the present invention. Beginning at step 120, the photo emitter 24 is operated to send light signals towards the photo detector 26. A device such as a micro-screw is used to precisely move the loop portion of the wire along the Z axis in very small increments (e.g., 0.001 mm), although other devices may be used to move the loop portion in larger increments. As the wire 16 moves in the path of the light signals, the amount of light received by the photo detector 26 changes and these changes are reflected in the electrical signal output of the detector 26. The varying displacement of the wire 16 along the Z axis is mapped or associated with the electrical signal output of the photo detector 26, and these associations are stored in the memory of the processor 30. By way of example only, the graph in FIG. 7 shows that as the amount of the loop portion displacement measured in mm units increases the detector output signal increases in mV units. The solid circles in the graph show that in the range of about a 0.7–1.1 mm displacement of the loop portion from its initial resting position (i.e., 0.0 mm displacement), the signal output of detector 26 is substantially proportional to the displacement of the loop portion. This relationship can be expressed as:

$$\frac{\delta U [\text{mV}]}{\delta z [\text{mm}]} = 421$$

Here, $\delta z$ represents the change in the position of the loop portion, and $\delta U$ is the change in the detector signal. A least-squares fit of the straight line shown in the graph through the solid circles results in a relationship of $U[\text{mV}] = m_0 + m_1 z[\text{mm}]$ with $m_0 = -110$ and $m_1 = 421$. Further, $\delta U = 1$ mV corresponds to a current of $\delta/I = \delta U/R = 0.16\ \mu A$ when an external circuit resistor having a value of $R = 6.35\ k\Omega$ is used on the detector 26 output signal.

Next at step 140, the fundamental resonance frequency ("$f_1$") and quality factor ("Q") values of the wire 16 are determined. The $f_1$ value is unique to wire 16 and may depend upon a number of factors including the type of material, diameter and dimensions used to form the wire 16, and ambient temperature surrounding the wire 16, for example. In this example, power source 20 supplies the wire 16 with an AC electrical current having an amplitude of about 170 mA, although a number of other amplitudes may be used depending upon the application of sensor device 12 and the intensity of the magnetic fields desired to be sensed. The frequency of the AC electrical current may be gradually increased from an initial minimum frequency (e.g., 0 Hz) up to a maximum frequency (e.g., 262 Hz), although the frequency may be decreased from a maximum frequency to a minimum frequency, for example. The amplitude of the electrical signal output from photo detector 26 is measured for each frequency that the AC electrical current supplied to wire 16 is adjusted to.

Figure 8:
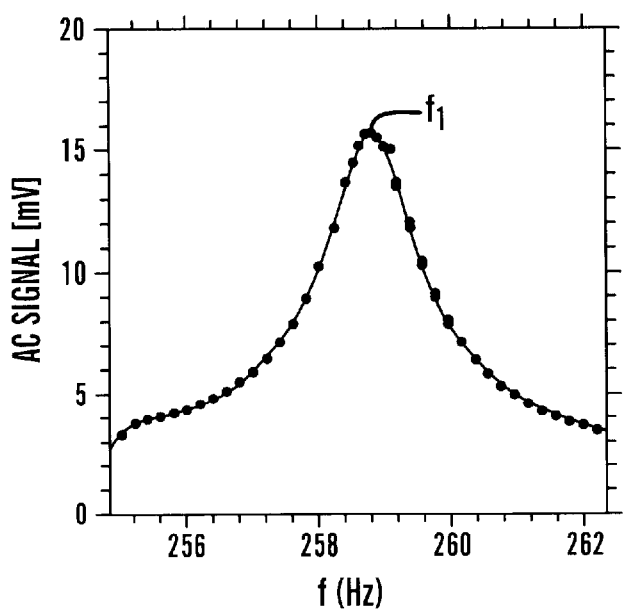
FIG. 8 is a graph showing an amplitude of an electrical signal output from the detection system when an electrical current is applied to the wire at various frequencies.

Referring to the graph in FIG. 8, the value of the amplitude of the electrical signal output from photo detector 26, which represents the mechanical resonance of the wire 16, is indicated by a solid circle for each frequency value. The exemplary data obtained from the graph (i.e., solid circles) may be used to determine the $f_1$ and Q values for wire 16 by applying the data to the following equation:

$$A = \frac{A_0}{\sqrt{(f^2 - f_1^2)^2 + f^2 f_1^2 / Q^2}}$$

In the equation above, $A_0$ is a constant, and the equation is derived from the following equation:

$$I \frac{d^2 \alpha}{dt^2} = -\left(\frac{\pi S d^2}{16 L}\right) \alpha - K \frac{d\alpha}{dt} + T_l(t)$$

Thus, the $f_1$ value for wire 16 in this example is about 259 Hz, and the Q factor is about 198. These values are stored in the memory of the processor 30 for later retrieval and processing as described further herein.

Next at step 160, power source 20 supplies a sinusoidal AC electrical current to the wire 16 having a peak amplitude of 85 mA and at the resonance frequency $f_1$ (i.e., 259 Hz) determined above. At substantially the same time, the photo emitter 24 is operated to send light signals towards inlet 27 in the photo detector 26, if not already operating. The photo detector 26 receives the light signals and transmits electrical signals to the processor 30 representing the amount of light signals being received at the inlet 27. A Hall probe is placed along side the device 12. A magnetic force By is applied to the device 12 and the Hall probe by a small permanent calibration magnet. The calibration magnet is placed an initial distance away from the device 12 and the Hall probe (e.g., 0.00 mm), and the magnet is gradually moved away to change the intensity of the magnetic force By In moving the calibration magnet away from the device 12 and the probe, the intensity of the force $B_y$ is gradually decreased from an initial maximum intensity to a minimum intensity.

Figure 9:
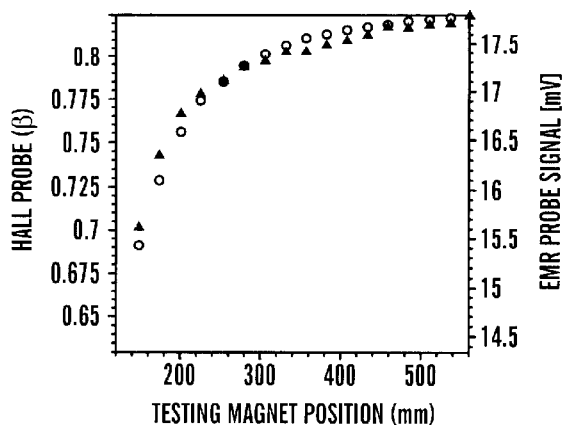
FIG. 9 is a graph showing the relationship between a Hall probe measurement taken at various magnetic field intensities and an electrical signal output from the detection system.
Figure 10:
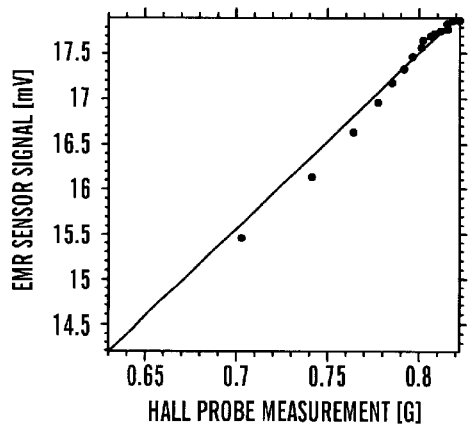
FIG. 10 is a graph showing an electrical signal output from the detection system as a function of a magnetic field measured with a Hall probe.

Referring to the graph in FIG. 9, the magnetic field intensities measured by the Hall probe as the magnet is moved away from the probe is represented by the solid triangles, and the empty circles represent the amplitudes of the electrical signals output from the photo detector 26 for the magnetic field intensities measured by the Hall probe as indicated by the solid triangles. These relationships are stored in the memory of the processor 30 for further processing and retrieval as described herein. Referring to FIG. 8, the graph shows a plot of the electrical signal amplitudes output from the detector 26 compared with the magnetic field intensity measurements taken by the Hall probe and fitted in with linear dependence. This fit provides:

$$\frac{\delta B[G]}{\delta U_{AC}[\text{mV}]} \approx 0.0518$$

Thus, a 1 mV change of the electrical signal indicates about a 52 mG change of the magnetic field intensity. Since the size of the calibration magnet is much smaller than the distance between the device 12 and the calibration magnet and the Hall probe and the magnet, the dependence of the magnetic field intensity on a position p can be approximated by:

$$B(p) = C_1 + \frac{C_2}{(p - C_3)^3}$$

Here, $C_1$, is a parameter that represents either the background field or the zero drift for the Hall probe. The parameter $C_2$ is proportional to the calibration magnet magnetic moment, and the parameter $C_3$ is set by the location of the Hall probe in a coordinate system used to define the calibration magnet position. The measurements taken from the Hall probes and the device 12 are applied to the equation above using $C_1$, $C_2$ and $C_3$ as free parameters.

Figure 11:
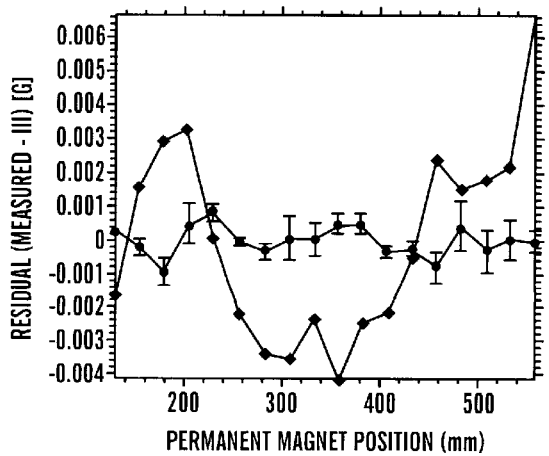
FIG. 11 is a graph showing a residual of measured fit for the magnetic sensor system in accordance with one or more embodiments and a Hall probe.

Referring to the graph in FIG. 11, a residual of the measured fit for the device 12 and the Hall probe is shown. At each point (i.e., solid circles), the electrical signal from the photo detector 26 is measured one or more times. The bars extending vertically from each point in the graph represent lo errors found from a statistical analysis of the measurements. The diamonds in the graph represent the measurements taken by the Hall probe. Thus, for each electrically signal amplitude output from the detector 26, a magnetic field intensity value is determined and is stored in the memory of the processor 30 for later retrieval and processing as described herein. The device 12 is now calibrated to sense magnetic signals as described further herein.

Referring back to FIG. 5 and next to step 200, once the device 12 is calibrated as described above in connection with steps 100–160, the device 12 may be operated to sense magnetic signals. Power source 20 supplies an AC electrical current to the wire 16 having a peak amplitude of 85 mA and at the resonance frequency $f_1$ (i.e., 259 Hz) determined above during calibration at step 140. At substantially the same time, the photo emitter 24 is operated to send light signals towards inlet 27 in the photo detector 26. The photo detector 26 receives the light signals and transmits electrical signals representing the amount of light signals being received at the inlet 27 to the processor 30.

Next at step 300, a vertical magnetic force $B_y$ is applied to the device 12 so that the magnetic field substantially surrounds at least the loop portion of the wire 16.

Next at step 400, the loop portion of wire 16 begins to vibrate or move. The degree or amount of vibration or movement of the loop portion depends upon the intensity of the magnetic field $B_y$ substantially surrounding the loop portion.

Next at step 500, the loop portion of the wire 16 moves into the path of the light signals being sent from the photo emitter 24 towards the photo detector 26 and therefore deflects at least a portion of the light signals away from the detector 26. The electrical signals being transmitted from the detector 26 to the processor 30 change to reflect the difference in the amount of light signals being received at the inlet 27 of the detector 26. This movement or vibration is detected and quantified by the detection system 22 and the processor 30 in the reporting system 28 based upon the relationships determined during the calibration performed in steps 100–160 between the displacement of the wire 16, detection system 22 output, and the magnetic field intensities. The processor 30 compares the value representing the amount of light signals being received by the detector 26 with the stored relationships in the memory of the processor 30 to determine the intensity of the magnetic field substantially surrounding the looped portion of the wire 16 at that instance.

Next at step 600, the display device 32 of the reporting system 28 displays the determined magnetic field intensity. The device 12 is operated as described above in steps 200–600 until magnetic fields are no longer desired to be sensed. At this point, the electrical currents applied to the wire 16, the light signals sent from the photo emitter 24 to the photo detector 26, and the electrical signals representing the amount of light signals received by the photo detector 26 to the processor 30, and the operation of the reporting system 28 as described above cease.

In an alternative embodiment of system 10, instead of using a photo emitter 24 and a photo detector 26, a pair of capacitor plates are used. The system 20 operates in the same manner in this embodiment as described above in connection with one or more embodiments, except the movement of the wire 16 in between the plates and within the capacitive field formed therein changes the capacitance value measured between the plates. However, these changes in the capacitance value are used in the same manner as described above with respect to using the changes in the electrical signal values output from the photo detector 26 as described above.

Figure 12:
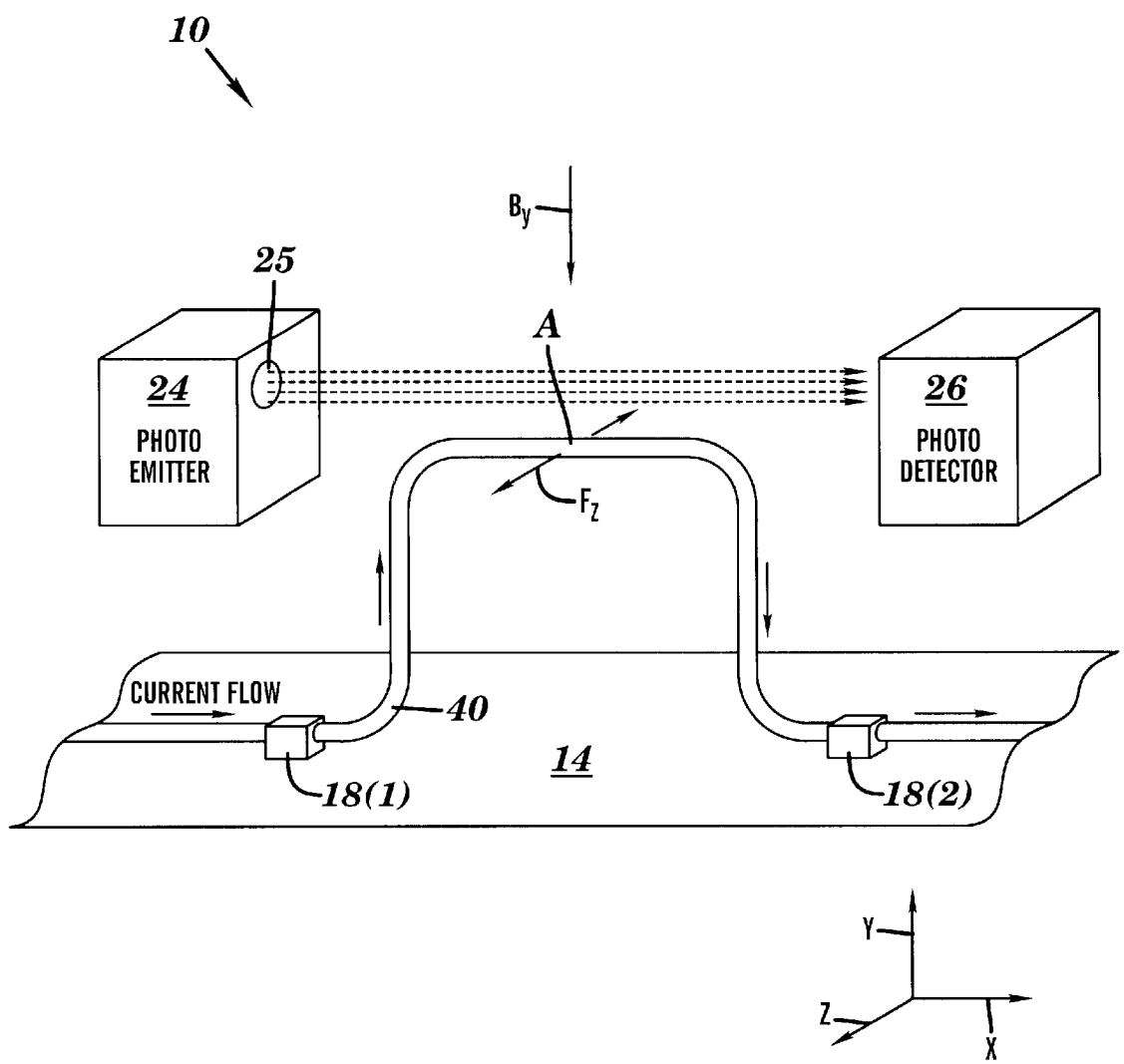
FIG. 12 is a partial perspective view of a system for sensing magnetic fields in accordance with another embodiment of the present invention.
Figure 13:
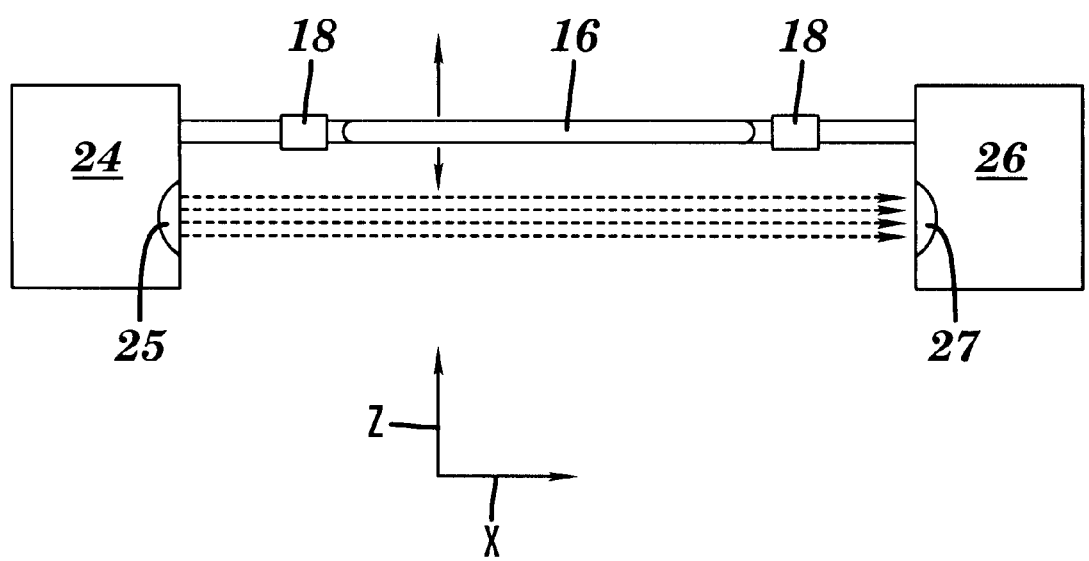
FIG. 13 is a partial top view of the system for sensing magnetic fields shown in FIG. 12.

Referring to FIGS. 12–13, an alternative embodiment of system 10 will now be described. Like reference numbers in FIGS. 12–13 are identical to those in and described with reference to FIG. 1. Further, the device 12 in this embodiment is the same as described above with reference to FIGS. 1–4 in connection with one or more embodiments, except in this embodiment an element 40 is used instead of the wire 16. Further, the element 40 is the same as the wire 16 except an interior portion of the element 40 in between connectors 18 has a substantially square portion formed in a semi square configuration instead of the loop configuration. The square portion is created by bending or forming a vertical section in the interior portion of the element 40 after the connector 18(1), bending or forming the vertical section into a horizontal section that continues from the vertical section, bending or forming the horizontal section into another vertical section, and then bending or forming the other vertical section to form another horizontal section that continues over the base 14 and through the connector 18(2). In this embodiment, each of the vertical and horizontal sections in the square portion may have a length up to about 1 mm, although other dimensions may be used depending upon a number of factors such as the material used to form the element 40, the particular application of the device 12, or the intensities of the magnetic fields desired to be sensed.

The same steps are performed for sensing magnetic fields as described above in connection with steps 100–600 in FIGS. 5–6, except at steps 100, 120–180, and 400, the element 40 moves instead of the wire 16. Furthermore, the apex A (i.e., the horizontal section) of the square portion of element 40 is displaced back and forth in a direction $F_z$ to create a vibrating movement along the Z axis in response to AC current being supplied to the element 40 and a magnetic force of $B_y$ being applied on the element 40.

Having thus described the basic concept of the invention, it will be rather apparent to those skilled in the art that the foregoing detailed disclosure is intended to be presented by way of example only, and is not limiting. Various alterations, improvements, and modifications will occur and are intended to those skilled in the art, though not expressly stated herein. These alterations, improvements, and modifications are intended to be suggested hereby, and are within the spirit and scope of the invention. Further, the recited order of elements, steps or sequences, or the use of numbers, letters, or other designations therefor, is not intended to limit the claimed processes to any order except as may be explicitly specified in the claims. Accordingly, the invention is limited only by the following claims and equivalents thereto.

What is claimed is:

1. A system for sensing fields, the system comprising:
   a conductive element connected at a first and a second location to a base, a portion of the conductive element between the first and second locations has a section in the portion which forms an apex with respect to one or more other sections within the portion and the portion is spaced apart from the base;
   a monitoring system that detects movement at least at the section in the portion which forms the apex while an electrical current is sent through the conductive element and a magnetic field surrounds at least the portion; and
   a reporting system that determines one or more characteristics of the magnetic field based upon the detected movement of the section in the portion of the conductive element.

2. The system as set forth in claim 1 wherein the portion has a loop or circular configuration.

3. The system as set forth in claim 1 wherein the portion has a square configuration.

4. The system as set forth in claim 1 further comprising an alternating current power source that supplies the conductive element with the electrical current.

5. The system as set forth in claim 1 wherein the monitoring system further comprises a set of electrodes spaced apart to form a capacitor, the detected movement in between the electrodes altering a capacitance value across the electrodes, the reporting system determines the one or more magnetic field characteristics based upon the altered capacitance values.

6. The system as set forth in claim 1 wherein the monitoring system further comprises a photo emitter that emits light towards an inlet in a photo detector, the movement deflecting at least a portion of the light away from the photo detector inlet, the reporting system determines the one or more magnetic field characteristics based upon an amount of light deflected away from the inlet.

7. The system as set forth in claim 1 wherein the reporting system further comprises a digital voltmeter or an oscilloscope that displays the determined magnetic field characteristics.

8. The system as set forth in claim 1 further comprising an enclosure system that shields at least the detection system from ambient light.

9. The system as set forth in claim 1 further comprising an enclosure system that seals at least the portion in a vacuum.

10. The system as set forth in claim 1 wherein the one or more magnetic field characteristics comprise magnetic field intensity and a presence of a magnetic field.

11. A method for sensing fields, the method comprising:
    sending an electrical current through a conductive element connected at a first and a second location to a base where a portion of the wire between the first and second locations has a section in the portion which forms an apex with respect to one or more other sections within the portion and the portion is spaced apart from the base;
    detecting movement at least at the section in the portion which forms the apex while sending the electrical current through the conductive element and a magnetic field surrounds the conductive element; and
    determining one or more characteristics of the magnetic field based upon the detected movement of the section in the portion of the conductive element.

12. The method as set forth in claim 11 further comprising forming a portion of the conductive element into a square configuration.

13. The method as set forth in claim 11 wherein sending the electrical current further comprises supplying the conductive element with an alternating current.

14. The method as set forth in claim 11 wherein supplying the conductive element with an alternating current further comprises applying a constant amperage to the conductive element at a fundamental resonance frequency of the conductive element to determine one of the one or more magnetic field characteristics, the one magnetic field characteristic being a magnetic field intensity.

15. The method as set forth in claim 11 wherein supplying the conductive element with an alternating current further comprises increasing a frequency of the alternating current from an initial frequency to a maximum frequency, and determining a maximum amplitude of the alternating current while increasing the frequency to determine a fundamental resonance frequency of the conductive element.

16. The method as set forth in claim 11 wherein detecting movement in the conductive element further comprises surrounding the conductive element with a set of electrodes spaced apart to form a capacitor, the conductive element movement in between the electrodes altering a capacitance value across the electrodes, the altered capacitance values being used to determine the one or more magnetic field characteristics.

17. The method as set forth in claim 11 wherein detecting movement in the conductive element further comprises emitting light from a photo emitter towards an inlet in a photo detector, the conductive element movement deflecting at least a portion of the light away from the photo detector inlet, an amount of light deflected away from the inlet being used to determine the one or more magnetic field characteristics.

18. The method as set forth in claim 11 wherein detecting movement in the conductive element further comprises emitting light from a photo emitter towards an inlet in a photo detector, the conductive element movement deflecting at least a portion of the light away from the photo detector inlet, an amount of light deflected away from the inlet being used to determine the one or more magnetic field characteristics.

19. The method as set forth in claim 11 wherein reporting the determined magnetic field characteristics further comprises displaying the determined magnetic field characteristics.

20. The method as set forth in claim 11 further comprising deflecting ambient light away from at least a detection system that detects the movement.

21. The method as set forth in claim 11 further comprising sealing at least the portion in a vacuum.

22. The method as set forth in claim 11 wherein one of the one or more magnetic field characteristics comprises magnetic field intensity.

* * * * *